United States Patent

[11] 3,585,409

[72] Inventors Takaaki Kato
Toyohashi-shi;
Mamoru Kawakubo, Kariya-shi, both of, Japan
[21] Appl. No. 841,829
[22] Filed July 15, 1969
[45] Patented June 15, 1971
[73] Assignee Nippon Denso Kabushiki Kaisha
Kariya-shi, Japan
[32] Priority Sept. 19, 1968
[33] Japan
[31] 43/81890

[54] MONOSTABLE MULTIVIBRATOR INCLUDING RESETTING MEANS
1 Claim, 2 Drawing Figs.

[52] U.S. Cl. .......... 307/273, 328/207
[51] Int. Cl. .......... H03k 3/10
[50] Field of Search .......... 307/272, 273, 291, 247A; 328/202, 207

[56] References Cited

UNITED STATES PATENTS

| | | | |
|---|---|---|---|
| 2,903,607 | 9/1959 | Danner et al. .......... | 307/247 |
| 3,041,477 | 6/1962 | Budts et al. .......... | 307/291 |

*Primary Examiner*—Stanley D. Miller, Jr.
*Attorney*—Cushman, Darby & Cushman

ABSTRACT: A monostable multivibrator including resetting means, comprising a third transistor connected in series with that one of two transistors constituting a monostable multivibrator which applies a voltage between the base and the emitter of the other one of said two transistors upon conduction thereof, and a parallel circuit of a resistor and capacitor connected between the base and the emitter of said third transistor, thereby rendering said other transistor conductive first under any condition when a power source switch is closed.

PATENTED JUN 15 1971 3,585,409

INVENTORS

Takaaki Kato
Mamoru Kawakubo

BY Cushman, Darby & Cushman

ATTORNEYS

MONOSTABLE MULTIVIBRATOR INCLUDING RESETTING MEANS

BACKGROUND OF THE INVENTION

1. Field of the Invention

This invention relates to a monostable multivibrator adapted to avoid error operation which tends to occur upon closure of a power source switch.

2. Description of the Prior Art

The conventional monostable multivibrator has such a circuit arrangement as shown in FIG. 1, wherein when a power source switch 1 is closed so that a gate signal becomes absent at a gate terminal 2, there is established a stable state in which a transistor 4 is rendered nonconductive while a transistor 5 is rendered conductive, and a capacitor 3 is sufficiently charged in such polarity as shown in the drawing. In such state, if the power source switch 1 is opened, then the charge at the capacitor 3 is discharged through resistors 6 and 7. However, if the power source switch 1 is again closed before the capacitor 3 is completely discharged, there may occur a certain possibility that the transistor 5 is rendered conductive momentarily earlier than the transistor 4. Furthermore, at this point, the remaining charge at the capacitor 3 is applied as reverse bias between the emitter and the base of the transistor 5 so that the transistor 5 is maintained in the nonconducting state and the transistor 4 in the conducting state until the charge at the capacitor 3 is completely discharged. By closing the power source switch 1, therefore, error operation is caused as if a gate signal had been applied to the gate terminal 2.

SUMMARY OF THE INVENTION

It is an object of the present invention to provide a monostable multivibrator including resetting means, comprising a third transistor connected in series with that one of two transistors constituting the monostable multivibrator which applies a voltage between the base and the emitter of the other one of said two transistors upon conduction thereof, and a parallel circuit of a resistor and capacitor connected between the base and the emitter of said third transistor.

In accordance with the present invention, since the aforementioned transistor 8 is rendered conductive with a delay corresponding to a time in which the capacitor 11 is completely discharged, the transistor 5 is always rendered conductive earlier than the transistor 4, even if any charge is still present at the capacitor 3 when the power source switch 1 is opened, thus preventing the possibility of error operation.

DESCRIPTION OF THE PREFERRED EMBODIMENT

Figure 1:
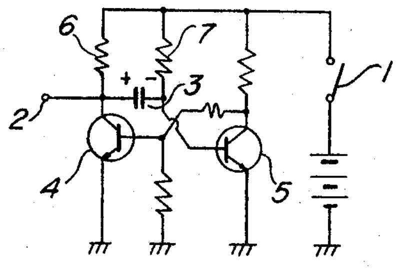
FIG. 1 is a circuit diagram showing the conventional monostable multivibrator.
Figure 2:
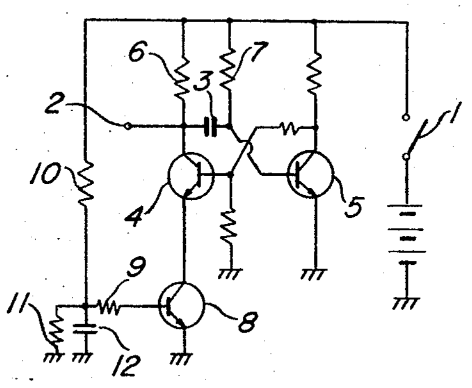
FIG. 2 is a circuit diagram showing the monostable multivibrator including resetting means according to an embodiment of the present invention.

The present invention will now be described with respect to the embodiment shown in the drawing. In FIG. 2, circuit elements indicated by numerals 1 to 7 correspond to monostable multivibrator shown in FIG. 1. A transistor 8 is connected in series with the emitter of the transistor 4 which is adapted to be reversed in operation upon arrival of a gate signal from the gate terminal 2 thereat. Further, a base current is supplied to the transistor 8 through resistors 9 and 10. A resistor 11 and capacitor 12 are connected in parallel between the base and the emitter of the transistor 8.

Description will now be made of the operation of the present monostable multivibrator having the foregoing arrangement. When the power source switch 1 is closed, the base current is made to flow through the transistor 8 with a delay corresponding to the charging time of the capacitor 12, even under the condition that any portion of that charge at the capacitor which has been charged in the stable state prior to the closure of the power source switch. This means that the transistor 8 is not switched from the nonconducting state to the conducting state until the predetermined time lapses. Thus, the transistor 4 is always rendered conductive later than the transistor 5, so that there will occur no possibility of error operation. Furthermore, since the transistor 8 performs the aforementioned operation every time the power source switch 1 is closed, the capacitor 12 is discharged through the resistor 11 during the nonconduction of the transistor 8. This discharging time can be determined to be as short as desired. On the other hand, the discharging time of the capacitor 3 cannot be shortened to prevent error operation since it depends upon the time for which the monostable multivibrator is operated by applying a gate signal to the gate terminal 2.

Advantageously, experimental results show that the waveform is distorted during the operation and the operation is badly influenced by the fact that the transistor 8 is connected in series with the transistor 4 and the resistor 11 and capacitor 12 are connected in parallel between the base and the emitter of the transistor 8 as in the foregoing embodiment.

It is also possible to prevent error operation tending to occur when the power source switch 1 is closed, by inserting a capacitor between the base and the emitter of the transistor 4. However, it has been found that such arrangement cannot be put to practical use because the waveform tends to be greatly distorted during the operation.

We claim:

1. A monostable multivibrator including resetting means, comprising a third transistor connected in series with that one of two transistors constituting the monostable multivibrator which applies a voltage across a capacitor to the other one of said two transistors upon conduction thereof, and a parallel circuit of a resistor and capacitor connected between the base and the emitter of said third transistor.